(12) United States Patent
Choi (10) Patent No.: US 12,346,596 B2
(45) Date of Patent: Jul. 1, 2025

(54) SEMICONDUCTOR MEMORY DEVICE FOR PERFORMING PROGRAM OPERATION AND METHOD OF OPERATING THE SAME

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 98 days.

(21) Appl. No.: 17/970,212

(22) Filed: Oct. 20, 2022

(65) Prior Publication Data

US 2023/0229344 A1  Jul. 20, 2023

(30) Foreign Application Priority Data

Jan. 20, 2022  (KR) .................. 10-2022-0008445

(51) Int. Cl.
| G11C 16/10 | (2006.01) |
| G06F 3/06 | (2006.01) |
| G11C 16/04 | (2006.01) |
| G11C 16/34 | (2006.01) |
| G11C 8/08 | (2006.01) |
| G11C 16/08 | (2006.01) |
| G11C 16/30 | (2006.01) |

(52) U.S. Cl.
CPC .......... *G06F 3/0655* (2013.01); *G06F 3/0604* (2013.01); *G06F 3/0679* (2013.01); *G11C 16/0483* (2013.01); *G11C 16/10* (2013.01); *G11C 16/3418* (2013.01); *G11C 16/3427* (2013.01); *G11C 8/08* (2013.01); *G11C 16/08* (2013.01); *G11C 16/30* (2013.01); *G11C 16/3431* (2013.01)

(58) Field of Classification Search
CPC .... G06F 3/0655; G06F 3/0604; G06F 3/0679; G11C 16/0483; G11C 16/10; G11C 16/3418; G11C 16/3427; G11C 16/08; G11C 16/30
See application file for complete search history.

(56) References Cited

U.S. PATENT DOCUMENTS

| 2010/0067305 A1* | 3/2010 | Park ................ G11C 16/12 365/189.09 |
| 2010/0202215 A1* | 8/2010 | Oh .................. G11C 16/10 365/185.23 |
| 2010/0246259 A1* | 9/2010 | Kwon .............. G11C 16/10 365/185.18 |

(Continued)

FOREIGN PATENT DOCUMENTS

| CN | 118016126 A | * | 5/2024 | .......... G06F 3/0619 |
| DE | 102022203786 A1 | * | 11/2022 | ......... G11C 11/5628 |

(Continued)

*Primary Examiner* — Mushfique Siddique
(74) *Attorney, Agent, or Firm* — IP & T GROUP LLP (57) ABSTRACT

A semiconductor memory device may include a memory cell array circuit and a word line driving circuit. The memory cell array circuit may be connected with a plurality of word lines to store data in a program operation. The word line driving circuit may drive a selected word line among the word lines using a program voltage in the program operation. The word line driving circuit may drive each of non-selected word lines adjacent to the selected word line using a step pass voltage including at least two step voltages.

18 Claims, 6 Drawing Sheets

(56) References Cited

U.S. PATENT DOCUMENTS

| | | | |
|---|---|---|---|
| 2011/0103154 A1* | 5/2011 | Cho | G11C 16/3418 365/185.23 |
| 2013/0010547 A1* | 1/2013 | Aritome | G11C 16/10 365/189.07 |
| 2013/0100747 A1* | 4/2013 | Leem | G11C 16/10 365/189.011 |
| 2023/0058168 A1 | 2/2023 | Choi | |

FOREIGN PATENT DOCUMENTS

| | | | | |
|---|---|---|---|---|
| KR | 10-2010-0115114 A | | 10/2010 | |
| KR | 1020100107176 A | | 10/2010 | |
| KR | 1020130006298 A | | 1/2013 | |
| KR | 1020130044693 A | | 5/2013 | |
| KR | 2014073815 A | * | 6/2014 | G11C 16/10 |
| KR | 10-1552210 B1 | | 9/2015 | |
| KR | 10-1805229 B1 | | 12/2017 | |
| KR | 10-2018-0080838 A | | 7/2018 | |
| KR | 10-2019-0029283 A | | 3/2019 | |
| KR | 10-1984796 B1 | | 6/2019 | |
| KR | 10-2019-0120502 A | | 10/2019 | |
| KR | 10-2070724 B1 | | 1/2020 | |

* cited by examiner

SEMICONDUCTOR MEMORY DEVICE FOR PERFORMING PROGRAM OPERATION AND METHOD OF OPERATING THE SAME

CROSS-REFERENCES TO RELATED APPLICATION

The present application claims priority under 35 U.S.C. § 119(a) to Korean patent application number 10-2022-0008445, filed on Jan. 20, 2022, which is incorporated herein by reference in its entirety.

BACKGROUND

1. Technical Field

Various embodiments of the present disclosure generally relate to a semiconductor memory device and a method of operating the same, more particularly, to a semiconductor memory device configured to perform a program operation for storing data and a method of operating the semiconductor memory device.

2. Related Art

Generally, a semiconductor memory device may be classified into a volatile memory device and a non-volatile memory device. The volatile memory device and the non-volatile memory device may perform a data-processing operation including storing data or outputting the stored data by receiving power. The volatile memory device may have a rapid data-processing operation speed. In contrast, the volatile memory device may continuously receive power for maintaining the stored data. The non-volatile memory device may maintain the stored data without the continuous power. In contrast, the non-volatile memory device may have a slow data-processing operation speed.

Recently, as processes and design technologies for the semiconductor memory device may have been greatly developed, a difference between the data-processing speed of the volatile memory device and the data-processing speed of the non-volatile memory device may be mostly reduced. Thus, from a viewpoint of the data maintenance, an interest may be focused on the non-volatile memory device free of power.

The non-volatile memory device may include a NAND type flash memory device having at least one string structure where a plurality of memory cells may be connected in series. Each of the memory cells of the NAND type flash memory device may include a floating gate. Thus, the memory cell may be written in a logic high data or logic low data by applying or discharging electrons into or from the floating gate through Fowler-Nordheim tunneling.

The non-volatile memory device including the NAND type flash memory device may perform a program operation for writing the data in the memory cell and a read operation for outputting the data written the memory cell. The non-volatile memory device may perform an erase operation for erasing the data stored in the memory cell before the program operation. The program operation, the read operation and the erase operation may be accompanied by a verification operation. The verification operation may verify whether or not desired data may be accurately stored in the memory cell after the program operation, the read operation and the erase operation.

The memory cell of the non-volatile memory device may be classified into a single level cell, a multi-level cell, a triple level cell and a quadruple level cell in accordance with numbers of a data distribution stored in one memory cell. The single level cell may write two logic data corresponding to 1 bit. The two logic data may correspond to the logic high data and the logic low data. The multi-level cell may write four logic data corresponding to 2 bits. The triple level cell may store eight logic data corresponding to 3 bits. The quadruple level cell may store sixteen logic data corresponding to 4 bits.

The memory cells constituting the string structure may be connected to one of a plurality of word lines. A selected word line connected to a memory cell to be programed or to be read may be driven by predetermined voltages. Hereinafter, the memory cell selected in the program operation and the read operation may be referred to as a selected memory cell. A remaining memory cell except for the selected memory cell may be referred to as a non-selected memory cell. A remaining word line except for the selected word line may be referred to as a non-selected word line. That is, the selected word line connected to the selected memory cell in the program operation and the read operation may be driven by the predetermined voltages.

As mentioned above, the memory cells may be serially connected with each other to have the string structure. As manufacturing processes may have been gradually developed, a gap between the memory cells may have been narrowed. Thus, when the selected word line may be driven by a program voltage in accordance with the program operation with respect to the selected memory cell, a voltage level of the non-selected word line may be changed by a coupling effect. When the voltage level change by the coupling effect may become larger, the semiconductor memory device may not perform the stable program operation.

SUMMARY

Various embodiments of the present disclosure provide a semiconductor memory device that may be capable of driving an adjacent word line by a step voltage in a program operation for storing data.

Various embodiments of the present disclosure also provide a method of operating the above-mentioned semiconductor memory device.

According to various embodiments of the present disclosure, there may be provided a semiconductor memory device. The semiconductor memory device may include a memory cell array circuit and a word line driving circuit. The memory cell array circuit may be connected with a plurality of word lines to store data in a program operation. The word line driving circuit may drive a selected word line among the word lines using a program voltage in the program operation. The word line driving circuit may drive each of non-selected word lines adjacent to the selected word line using a step pass voltage including at least two step voltages.

According to various embodiments of the present disclosure, there may be provided a method of operating a semiconductor memory device. The semiconductor memory device may include a selected word line among a plurality of word lines corresponding to a program operation, an adjacent word line and a next adjacent word line. In the method of operating the semiconductor memory device, the selected word line may be driven using a program voltage in the program operation. A first voltage level of the next adjacent word line, which may be higher than a pass voltage, may be primarily changed into a second voltage level lower than the first voltage level. A third voltage level of the adjacent word line, which may be lower than the pass voltage, may be secondarily changed into a fourth voltage level higher than the third voltage level.

According to various embodiments of the present disclosure, the adjacent word line may be driven using the step voltage so that the program operation with respect to the selected memory cell may be stably performed.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
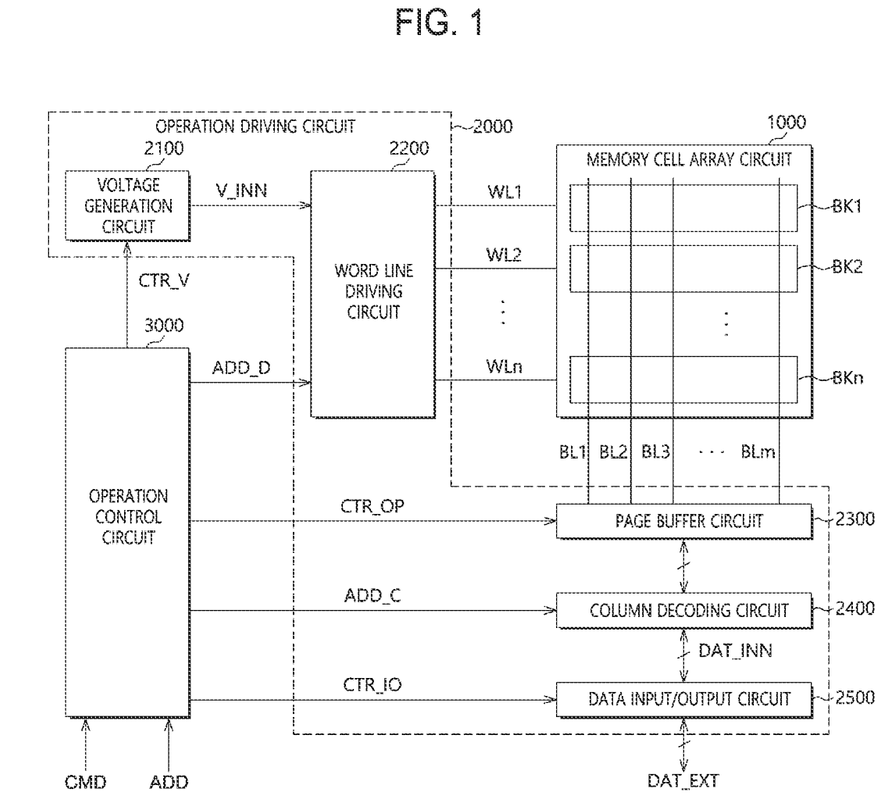
FIG. 1 is a block diagram illustrating a semiconductor memory device in accordance with various embodiments of the present disclosure.

FIG. 1 is a block diagram illustrating a semiconductor memory device in accordance with various embodiments of the present disclosure.

Referring to FIG. 1, a semiconductor memory device may include a memory cell array circuit 1000, an operation driving circuit 2000 and an operation control circuit 3000.

The memory cell array circuit 1000 may be configured to store data. The memory cell array circuit 1000 may include a plurality of memory block circuits BK1~BKn (where n is a natural number). Each of the memory block circuits BK1~BKn may include a plurality of memory cells for storing the data. Each of the memory cells may be connected to a plurality of word lines WL1~WLn and a plurality of bit lines BL1~BLm (where m is a natural number) to have a matrix structure. The word lines WL1~WLn may be driven by a predetermined voltage by a word line driving circuit 2200 in accordance with a program operation, a read operation, an erase operation and a verification operation. The bit lines BL1~BLm may be driven by a predetermined voltage in accordance with the data stored or to be stored in the memory cell.

The operation driving circuit 2000 may be configured to perform the program operation, the read operation, the erase operation and the verification operation with respect to the selected memory cell in the memory cell array circuit 1000. The operation driving circuit 2000 may include a voltage generation circuit 2100, a word line driving circuit 2200, a plurality of page buffer circuits 2300, a column decoding circuit 2400 and a data input/output circuit 2500.

The voltage generation circuit 2100 may be configured to generate an internal voltage V_INN for the program operation, the read operation, the erase operation and the verification operation. The voltage generation circuit 2100 may generate the internal voltage V_INN having various levels corresponding to each of the operations based on a voltage control signal CTR_V generated from the operation control circuit 3000.

The word line driving circuit 2200 may be configured to selectively apply the internal voltage V_INN generated from the voltage generation circuit 2100 to the word lines WL1~WLn. The word line driving circuit 2200 may receive the internal voltage V_INN from the voltage generation circuit 2100. The word line driving circuit 2200 may receive a drive address signal ADD_D from the operation control circuit 3000. The drive address signal ADD_D may selectively activate a corresponding word line among the word lines WL1~WLn. Thus, the word line driving circuit 2200 may activate the word lines WL1~WLn based on the drive address signal ADD_D and the internal voltage V_INN. The word line driving circuit 2200 may drive the activated word line using the internal voltage V_INN.

Although not depicted in drawings, the word line driving circuit 2200 may be connected with a drain selection line, a source selection line and a common source line in the memory cell array circuit 1000. Thus, the word line driving circuit 2200 may apply the internal voltage V_INN to the drain selection line, the source selection line and the common source line in accordance with the program operation, the read operation, the erase operation and the verification operation.

For example, the word line driving circuit 2200 may apply the program voltage of the internal voltage V_INN to the selected word line among the word lines WL1~WLn in the program operation. The word line driving circuit 2200 may apply a program pass voltage, which may have a voltage level lower than the program voltage, to a remaining non-selected word line.

The word line driving circuit 2200 may apply a read voltage to the selected word line in the read operation. The word line driving circuit 2200 may apply a read pass voltage, which may have a voltage level higher than the read voltage, to a non-selected word line. The word line driving circuit 2200 may apply a ground voltage to all word lines WL1~WLn in the erase operation. The word line driving circuit 2200 may apply a verification voltage to the selected word line in the verification operation. The word line driving circuit 2200 may apply a verification pass voltage, which may have a voltage level higher than the verification voltage, to a non-selected word line.

Each of the page buffer circuits 2300 may be connected with each of the bit lines BL1~BLm connected to the string. The page buffer circuits 2300 may be configured to transmit the data to the bit lines BL1~BLm in the program operation, respectively. The page buffer circuits 2300 may receive the data from the bit lines BL1~BLm in the read operation and the verification operation, respectively. Each of the page buffer circuits 2300 may include at least one latch circuit (not shown). Each of the latch circuits may perform a latching operation in accordance with the program operation, the read operation and the verification operation with respect to the data inputted/outputted based on an operation control signal CTR_OP generated from the operation control circuit 3000.

The column decoding circuit 2400 may be configured to control a transmission path of the inputted/outputted data. The column decoding circuit 2400 may receive the data outputted from the page buffer circuits 2300. The column decoding circuit 2400 may receive the data inputted from the data input/output circuit 2500. The column decoding circuit 2400 may receive a selection address signal ADD_C from the operation control circuit 3000 to control the transmission path of the data. The selection address signal ADD_C may function to select a corresponding bit line of the bit lines BL1~BLm.

The data input/output circuit 2500 may be configured to control an input/output with respect to external data DAT_EXT and internal data DAT_INN. The data input/output circuit 2500 may perform an input/output operation of the data based on an input/output control signal CTR_IO generated from the operation control circuit 3000. For example, the data input/output circuit 2500 may output the external data DAT_EXT, which may be inputted through a host device or a control device in the program operation, as the internal data DAT_INN based on the input/output control signal CTR_IO. The data input/output circuit 2500 may output the internal data DAT_INN, which may be inputted from the column decoding circuit 2400 in the read operation, as the external data DAT_EXT based on the input/output control signal CTR_IO.

The operation control circuit 3000 may be configured to control the voltage generation circuit 2100, the word line driving circuit 2200, the page buffer circuits 2300, the column decoding circuit 2400 and the data input/output circuit 2500 in the operation driving circuit 2000. For example, the operation control circuit 3000 may generate the voltage control signal CTR_V for controlling the voltage generation circuit 2100 based on the address signal ADD. The operation control circuit 3000 may generate the drive address signal ADD_D provided to the word line driving circuit 2200, the operation control signal CTR_OP for controlling the page buffer circuits 2300, the selection address signal ADD_C for controlling the column decoding circuit 2400 and the input/output control signal CTR_IO for controlling the data input/output circuit 2500. The operation control circuit 3000 may generate the various signals to control whole operations of the semiconductor memory device. That is, the semiconductor memory device may perform the program operation, the read operation, the erase operation and the verification operation by the operation control circuit 3000.

Figure 2:
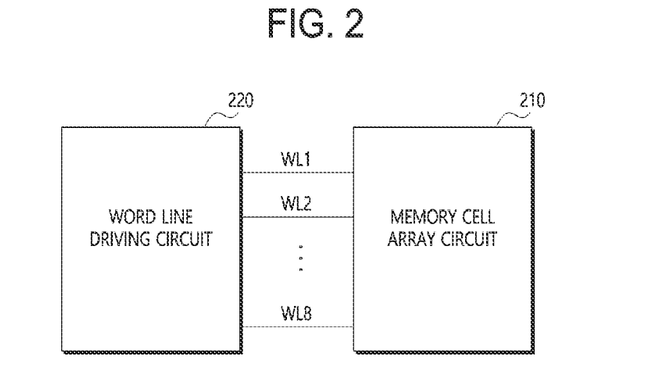
FIG. 2 is a block diagram illustrating a part of a semiconductor memory device in accordance with various embodiments of the present disclosure.

FIG. 2 is a block diagram illustrating a part of a semiconductor memory device in accordance with various embodiments of the present disclosure.

Referring to FIG. 2, a semiconductor memory device may include a memory cell array circuit 210 and a word line driving circuit 220. The memory cell array circuit 210 and the word line driving circuit 220 may correspond to the memory cell array circuit 1000 and the word line driving circuit 2200 in FIG. 1, respectively.

The memory cell array circuit 210 may be connected to a plurality of word lines WL1~WL8 to store data in a program operation. In various embodiments, the plurality of word lines may include first to eighth word lines WL1~WL8.

The word line driving circuit 220 may be configured to drive a selected word line among the plurality of word lines WL1~WL8 using a program voltage in the program operation. The word line driving circuit 220 may be configured to provide a first step voltage and a second step voltage. The first step voltage may be applied to non-selected word lines (hereinafter, referred to as adjacent non-selected word lines) closest to the selected word line. The second step voltage may be applied to non-selected word lines (hereinafter, referred to as next adjacent non-selected word lines) closest to the non-selected word lines receiving the first step voltage. The adjacent non-selected word lines may be positioned adjacent to the selected word line than any other word lines. The next adjacent non-selected word lines may be positioned adjacent to the adjacent non-selected word lines than any other word lines. For example, when the fourth word line WL4 may be the selected word line, the adjacent non-selected word lines may correspond the third and fifth word lines WL3 and WL5. The next adjacent non-selected word lines may include the second and sixth word lines WL2 and WL6.

The step pass voltage may include the at least two step voltages, which are different from each other. The adjacent non-selected word lines may be driven by the first step pass voltage V_SP1. The next adjacent non-selected word lines may be driven by the second step pass voltage V_SP2. The first step pass voltage V_SP1 and the second step pass voltage V_SP2 may have at least two different voltage levels in a program operation section. That is, the adjacent non-selected word line may have at least two operation sections having different voltage levels in the program operation section by the first step pass voltage V_SP1. The next adjacent non-selected word line may have at least two operation sections having different voltage levels in the program operation section by the second step pass voltage V_SP2.

According to various embodiments, the semiconductor memory device may drive each of the adjacent non-selected word line and the next adjacent non-selected word line using the step pass voltage including the at least two step voltages in the program operation. Thus, the semiconductor memory device may offset an overshoot with respect to the non-selected word line generated in the program operation. Particularly, when the selected word line may be driven by the program voltage, the overshoot generated in the adjacent non-selected word line may be offset.

Figure 3:
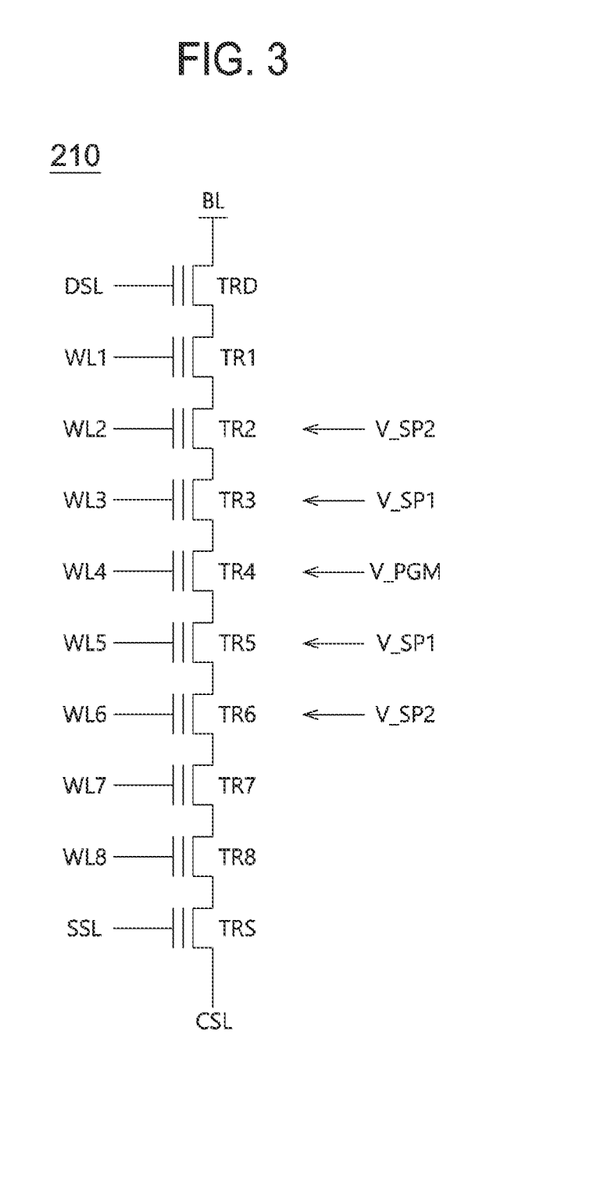
FIG. 3 is a circuit diagram illustrating a memory cell array circuit in FIG. 2 in accordance with various embodiments of the present disclosure.

FIG. 3 is a circuit diagram illustrating a memory cell array circuit in FIG. 2 in accordance with various embodiments of the present disclosure.

Referring to FIG. 3, the memory cell array circuit 210 may include at least one string. For example, the string may include eight memory cells configured to store data. Particularly, the string of the memory cell array circuit 210 may include a drain transistor TRD and a source transistor TRS. The drain transistor TRD may be connected with a bit line BL and a drain selection line DSL. The source transistor TRS may be connected with a common source line CSL and a source selection line SSL. The first to eighth memory cells TR1~TR8 may be serially connected between the drain transistor TRD and the source transistor TRS to have a string structure. Each of the first to eighth memory cells TR1~TR8 may be connected to each of the first to eighth word lines WL1~WL8.

For example, in the program operation with respect to the fourth memory cell TR4, the fourth word line WL4 connected to the fourth memory cell TR4 may be a selected word line. The third and fifth word lines WL3 and WL5 connected to the third and fifth memory cells TR3 and TR5, respectively, may be an adjacent non-selected word line. The second and sixth word lines WL2 and WL6 connected to the second and sixth memory cells TR2 and TR6 may be a next adjacent non-selected word line. Thus, the fourth word line WL4 among the word lines may be driven by a program voltage V_PGM. The third and fifth word lines WL3 and WL5 may be driven by the first step pass voltage V_SP1. The second and sixth word lines WL2 and WL6 may be driven by the second step pass voltage V_SP2.

That is, the fourth word line WL4 corresponding to the selected word line may be defined as an (N)th word line. The third and fifth word lines WL3 and WL5 corresponding to the adjacent non-selected word line may be defined as an (N±1)th word line. The third word line WL3 as the adjacent non-selected word line may be the (N−1)th word line. The fifth word line WL5 as the adjacent non-selected word line may be the (N+1)th word line. The second and sixth word lines WL2 and WL6 corresponding to the next adjacent non-selected word line may be defined as an (N±2)th word line. The second word line WL2 as the next adjacent non-selected word line may be the (N−2)th word line. The sixth word line WL6 as the next adjacent non-selected word line may be the (N+2)th word line. Therefore, the (N)th word line may be driven by the program voltage V_PGM in the program operation of the (N)th memory cell. The (N±1)th word line may be driven by the first step pass voltage V_SP1. The (N±2)th word line may be driven by the second step pass voltage V_SP2.

Figure 4:
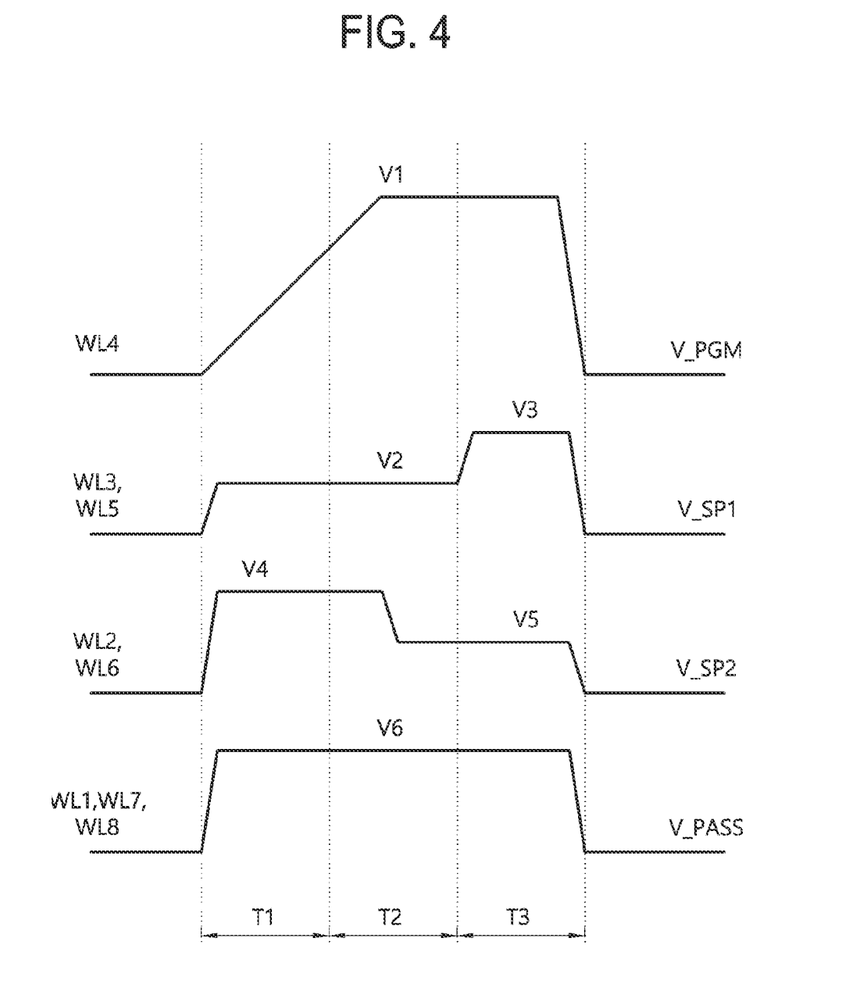
FIGS. 4 to 6 are timing charts illustrating an operation voltage with respect to a first step pass voltage and a second step pass voltage in FIG. 3 in accordance with various embodiments of the present disclosure.

FIG. 4 is a timing chart illustrating an operation voltage with respect to a first step pass voltage and a second step pass voltage in FIG. 3 in accordance with various embodiments of the present disclosure. FIG. 4 may show voltage levels for driving first to eighth word lines WL1~WL8. For convenience of description, the fourth word line WL4 may be referred to as a selected word line.

Referring to FIG. 4, the fourth word line WL 4 as the selected word line may be driven by the program voltage V_PGM in the program operation section. The program voltage V_PGM may include at least one step voltage. The program voltage V_PGM may be driven by a reset voltage before the program operation section. The program voltage V_PGM may be driven by a first step voltage V1 in the program operation section.

The third and fifth word lines WL3 and WL5 as the adjacent non-selected word line may be driven by the first step pass voltage V_SP1 in the program operation section. The first step pass voltage V_SP1 may include the at least two step voltages. That is, the first step pass voltage V_SP1 may be driven by the reset voltage before the program operation section. The first step pass voltage V_SP1 may be driven by a second step voltage V2 and a third step voltage V3. The first step pass voltage V_SP1 may be changed into the third step voltage V3 after the second step voltage V2. That is, a voltage level of the first step pass voltage V_SP1 corresponding to the second step voltage V2 may be changed into a voltage level corresponding to the third step voltage V3 higher than the second step voltage V2.

The second and sixth word lines WL2 and WL6 as the next adjacent non-selected word line may be driven by the second step pass voltage V_SP2 in the program operation section. The second step pass voltage V_SP2 may include the at least two step voltages similarly to the first step pass voltage V_SP1. That is, the second step pass voltage V_SP2 may be driven by the reset voltage before the program operation section. The second step pass voltage V_SP2 may be driven by a fourth step voltage V4 and a fifth step voltage V5. The second step pass voltage V_SP2 may be changed into the fifth step voltage V5 after the fourth step voltage V4. That is, a voltage level of the second step pass voltage V_SP2 corresponding to the fourth step voltage V4 may be changed into a voltage level corresponding to the fifth step voltage V5 lower than the fourth step voltage V4.

The program voltage V_PGM applied to the fourth word line WL4 may be increased to the first step voltage V1 in a first program section T1 entering into the program operation. The first step pass voltage V_SP1 applied to the third and fifth word lines WL3 and WL5 may be increased to the second step voltage V2 from the reset voltage. The second step pass voltage V_SP2 applied to the second and sixth word lines WL2 and WL6 may be increased to the fourth step voltage V4 from the reset voltage.

Because the voltage level of the program voltage V_PGM in an initial increased section of the program voltage V_PGM may not be so high, the coupling effect generated at the third and fifth word lines WL3 and WL5 may not cause a problem of the program operation.

However, the overshoot may be generated at the third and fifth word lines WL3 and WL5 as the adjacent non-selected word line in a second program section T2 in which the voltage level of the program voltage V_PGM may be gradually increased.

In various embodiments, in order to prevent the overshoot of the adjacent non-selected word line from being generated, the second step pass voltage V_SP2 for driving the next adjacent non-selected word line may be decreased from the fourth step voltage V4 to the fifth step voltage V5.

Particularly, the second and sixth word lines WL2 and WL6 as the next adjacent word line may be driven by the fourth step voltage V4 in the first program section T1. The second and sixth word lines WL2 and WL6 may be driven by the fifth step voltage V5 lower than the fourth step voltage V4 in the second program section T2. Thus, the coupling effect between the fourth word line WL4 and the third and fifth word lines WL3 and WL5 may be reduced to prevent the overshoot of the third and fifth word lines WL3 and WL5.

The first step pass voltage V_SP1 may be increased from the second step voltage V2 to the third step voltage V3 in a third program section T3 in which the program voltage V_PGM may be driven by the first step voltage V1. Thus, the coupling effect between the fourth word line WL4 and the third and fifth word lines WL3 and WL5 may be reduced to secure a stable drive environment of the fourth word line WL4 by the relatively high first step voltage V1.

The first, seventh and eighth word lines WL1, WL7 and WL8, which may not correspond to the selected word line, the adjacent non-selected word line and the next adjacent non-selected word line, may be driven by a pass voltage V_PASS. The pass voltage V_PASS may have a sixth step voltage V6 in the program operation section.

The second step voltage V2 may have the voltage level lower than the sixth step voltage V6 as the pass voltage V_PASS. The third and fourth step voltages V3 and V4 may have the voltage level higher than the sixth step voltage V6. The fifth step voltage V5 may have the voltage level similar to the sixth step voltage V6.

According to various embodiments, the semiconductor memory device may drive the adjacent word line using the first step pass voltage V_SP1 in the program operation. The next adjacent word line may be driven by the second step pass voltage V_SP2. Thus, the overshoot may be prevented in the program operation of the semiconductor memory device to secure the stable drive environment of the selected word line by the program voltage V_PGM.

Referring again to FIG. 3, the semiconductor memory device may perform the program operation with respect to the first memory cell TR1 positioned at an edge portion of the memory cell array circuit 210. The selected word line may be the first word line WL1. The adjacent non-selected word line may be the second word line WL2. The next adjacent non-selected word line may be the third word line WL3. Thus, the first word line WL1 may be driven by the program voltage V_PGM. The second word line WL2 may be driven by the first step pass voltage V_SP1. The third word line WL3 may be driven by the second step pass voltage V_SP2.

According to various embodiments, the semiconductor memory device may drive the adjacent non-selected word line and the next adjacent non-selected word line using the first and second step pass voltages V_SP1 and V_SP2, respectively, in the program operation with respect to the memory cell at the edge portion of the memory cell array circuit 210. Therefore, the semiconductor memory device may prevent the overshoot in the program operation to secure the stable program operation environment.

Figure 5:
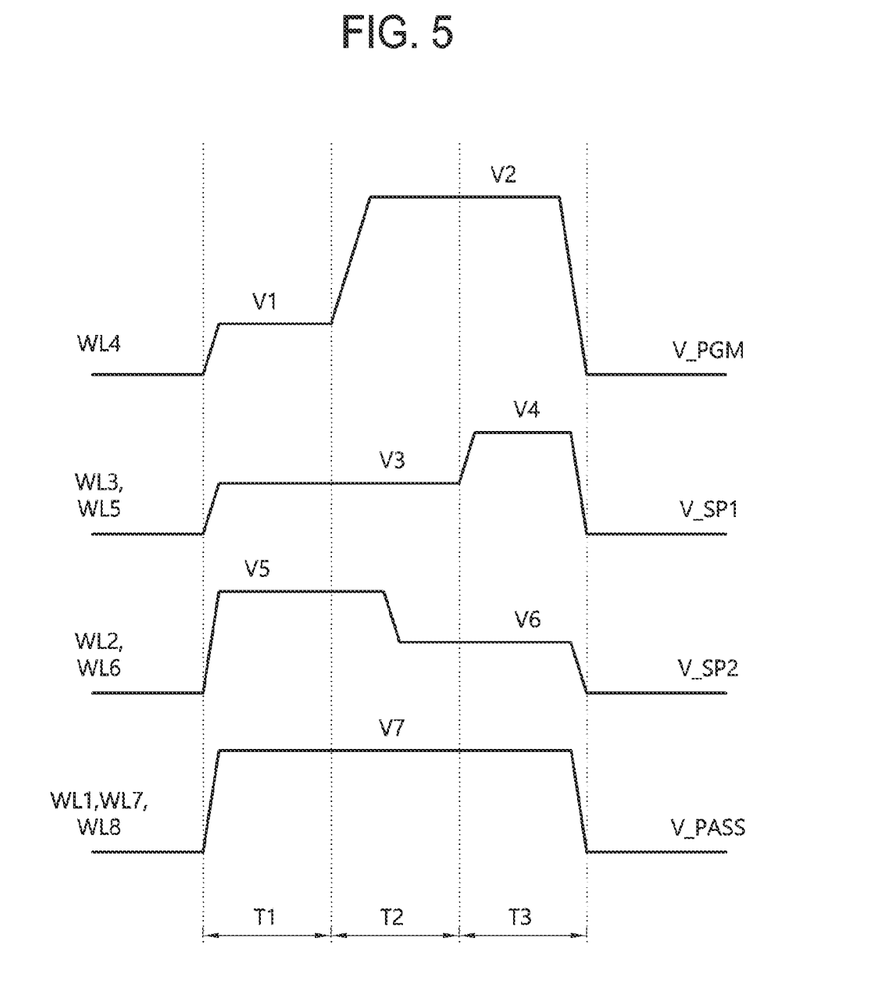

FIG. 5 is a timing chart illustrating an operation voltage with respect to a first step pass voltage and a second step pass voltage in FIG. 3 in accordance with various embodiments of the present disclosure. For convenience of description, the fourth word line WL4 may be referred to as a selected word line.

Referring to FIG. 5, the fourth word line WL 4 as the selected word line may be driven by the program voltage V_PGM in the program operation section. The program voltage V_PGM may include at least two step voltages. The program voltage V_PGM may be driven by a reset voltage before the program operation section. The program voltage V_PGM may be driven by first and second step voltages V1 and V2 in the program operation section.

The third and fifth word lines WL3 and WL5 as the adjacent non-selected word line may be driven by the first step pass voltage V_SP1 in the program operation section. The first step pass voltage V_SP1 may include the at least two step voltages. That is, the first step pass voltage V_SP1 may be driven by the reset voltage before the program operation section. The first step pass voltage V_SP1 may be driven by a third step voltage V3 and a fourth step voltage V4. The first step pass voltage V_SP1 may be changed into the fourth step voltage V4 after the third step voltage V3. That is, a voltage level of the first step pass voltage V_SP1 corresponding to the third step voltage V3 may be changed into a voltage level corresponding to the fourth step voltage V4 higher than the third step voltage V3.

The second and sixth word lines WL2 and WL6 as the next adjacent non-selected word line may be driven by the second step pass voltage V_SP2 in the program operation section. The second step pass voltage V_SP2 may include the at least two step voltages similar to the first step pass voltage V_SP1. That is, the second step pass voltage V_SP2 may be driven by the reset voltage before the program operation section. The second step pass voltage V_SP2 may be driven by a fifth step voltage V5 and a sixth step voltage V6. The second step pass voltage V_SP2 may be changed into the sixth step voltage V6 after the fifth step voltage V5. That is, a voltage level of the second step pass voltage V_SP2 corresponding to the fifth step voltage V5 may be changed into a voltage level corresponding to the sixth step voltage V6 lower than the fifth step voltage V5.

The program voltage V_PGM applied to the fourth word line WL4 may be increased to the first step voltage V1 in a first program section T1 entering into the program operation. The first step pass voltage V_SP1 applied to the third and fifth word lines WL3 and WL5 may be increased to the third step voltage V3 from the reset voltage. The second step pass voltage V_SP2 applied to the second and sixth word lines WL2 and WL6 may be increased to the fifth step voltage V5 from the reset voltage.

The second and sixth word lines WL2 and WL6 as the next adjacent word line may be previously driven by the fifth step voltage V5 in the first program section T1. The second and sixth word lines WL2 and WL6 may be driven by the sixth step voltage V6 lower than the fifth step voltage V5 in the second program section T2 in which the first step voltage V1 may be increased to the second step voltage V2. Thus, the coupling effect between the fourth word line WL4 and the third and fifth word lines WL3 and WL5 may be reduced to prevent the overshoot of the third and fifth word lines WL3 and WL5.

The first step pass voltage V_SP1 may be increased from the third step voltage V3 to the fourth step voltage V4 in a third program section T3 in which the program voltage V_PGM may be driven by the second step voltage V2. Thus, the coupling effect between the fourth word line WL4 and the third and fifth word lines WL3 and WL5 may be reduced to secure a stable drive environment of the fourth word line WL4 by the relatively high second step voltage V2.

The first, seventh and eighth word lines WL1, WL7 and WL8 may be driven by the pass voltage V_PASS. The pass voltage V_PASS may have a seventh step voltage V7 in the program operation section.

The third step voltage V3 may have the voltage level lower than the seventh step voltage V7 as the pass voltage V_PASS. The fourth and fifth step voltages V4 and V5 may have the voltage level higher than the seventh step voltage V7. The first and sixth step voltages V1 and V6 may have the voltage level similar to the seventh step voltage V7.

According to various embodiments, the semiconductor memory device may drive the adjacent word line using the first step pass voltage V_SP1 including the at least two step voltages in the program operation. The next adjacent word line may be driven by the second step pass voltage V_SP2. Thus, the overshoot may be prevented in the program operation of the semiconductor memory device to secure the stable drive environment of the selected word line by the program voltage V_PGM.

Figure 6:
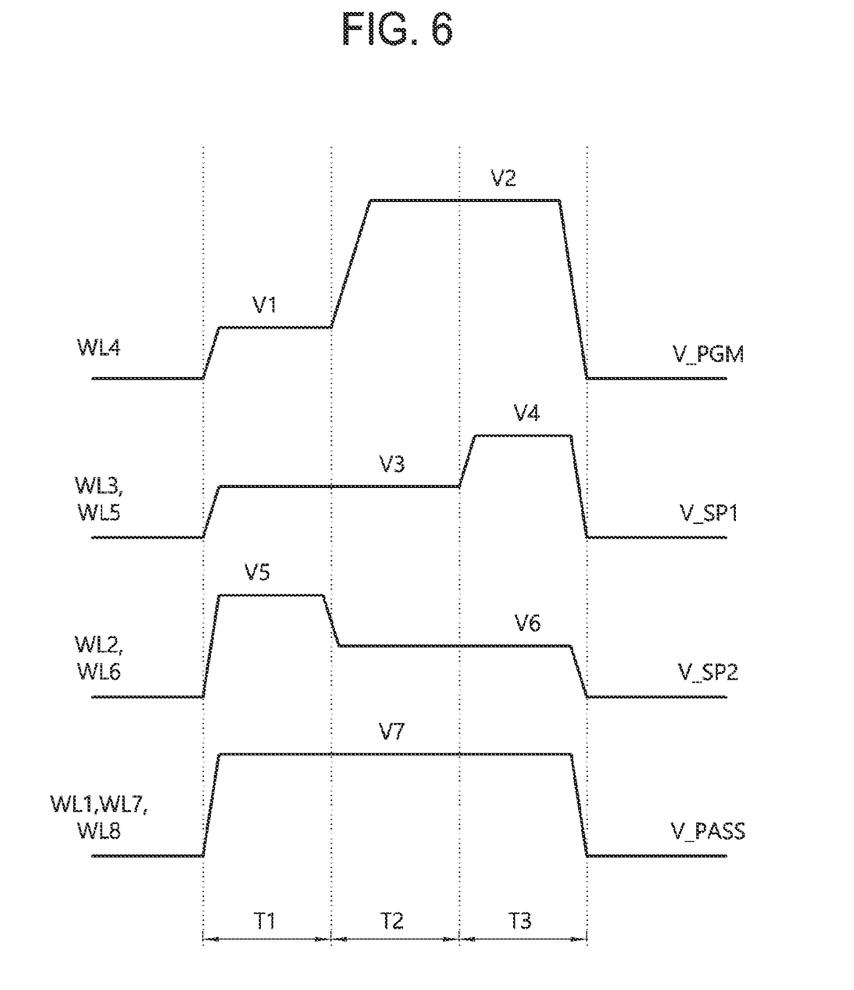

FIG. 6 is a timing chart illustrating an operation voltage with respect to a first step pass voltage and a second step pass voltage in FIG. 3 in accordance with various embodiments of the present disclosure.

A change point of the second step pass voltage V_SP2 in FIG. 6 may be different from a change point of the second step pass voltage V_SP2 in FIG. 5. In FIG. 5, the voltage level of the second step pass voltage V_SP2 may be changed in the second program section T2. In contrast, in FIG. 6, the voltage level of the second step pass voltage V_SP2 may be changed between the first program section T1 and the second program section T2. Particularly, the second step pass voltage V_SP2 in FIG. 6 may be changed from the fifth step voltage V5 to the sixth step voltage V6 between the first program section T1 and the second program section T2.

Thus, the overshoot of the third and fifth word lines WL3 and WL5 may be prevented to secure the stable program operation environment.

Figure 7:
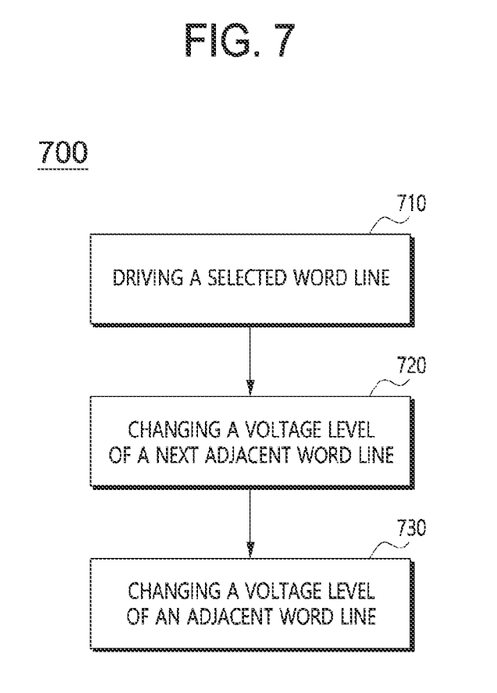
FIG. 7 is a flow chart illustrating a method of operating a semiconductor memory device in accordance with various embodiments of the present disclosure.

FIG. 7 is a flow chart illustrating a method of operating a semiconductor memory device in accordance with various embodiments of the present disclosure.

Referring to FIG. 7, a method 700 of operating a semiconductor memory device may include an operation 710 for driving a selected word line, an operation 720 for changing a voltage of a next adjacent word line and an operation 730 for changing a voltage of an adjacent word line.

The operation 710 for driving the selected word line may include driving the selected word line using the program voltage V_PGM in the program operation. As shown in FIGS. 4 to 6, the fourth word line WL4 as the selected word line may be driven by the program voltage V_PGM.

The operation 720 for changing the voltage level of the next adjacent word line may include changing a voltage level of the next adjacent word line from a first voltage level higher than the pass voltage V_PASS to a second voltage level. For convenience of description, the operation 720 for changing the voltage level of the next adjacent word line may be referred to as a primary change operation. The primary change operation 720 may change the first voltage level of the next adjacent word line into the second voltage level lower than the first voltage level. As shown in FIG. 4, the voltage level of the second and sixth word lines WL2 and WL6 as the next adjacent word line may be changed from the fourth step voltage V4 to the fifth step voltage V5 lower than the fourth step voltage V4.

The operation 730 for changing the voltage level of the adjacent word line may include changing a voltage level of the adjacent word line from a third voltage level lower than the pass voltage V_PASS to a fourth voltage level higher than the third voltage level. For convenience of description, the operation 730 for changing the voltage level of the adjacent word line may be referred to as a secondary change operation. The secondary change operation 730 may change the third voltage level of the adjacent word line into the fourth voltage level higher than the third voltage level. As shown in FIG. 4, the voltage level of the third and fifth word lines WL3 and WL5 as the adjacent word line may be changed from the second step voltage V2 to the third step voltage V3 higher than the second step voltage V2.

As shown in FIG. 4, a point where the fourth step voltage V4 of the second step pass voltage V_SP2 may be changed into the fifth step voltage V5 may be positioned before a point where the second step voltage V2 of the first step pass voltage V_SP1 may be changed into the third step voltage V3. That is, the primary change operation 720 and the secondary change operation 730 may be sequentially performed.

According to various embodiments, the method of operating the semiconductor memory device may include the primary change operation 720 and the secondary change operation 730 in the program operation to prevent the overshoot of the non-selected word line, thereby securing the stable program operation environment.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications would be apparent in view of the present disclosure and are intended to fall within the scope of the appended claims. Furthermore, the embodiments may be combined to form additional embodiments.

What is claimed is:

1. A semiconductor memory device comprising:
 a memory cell array circuit including a plurality of word lines and a plurality of memory cells connected to each of the plurality of word lines; and
 a word line driving circuit configured to apply a pulse of a program voltage to a selected word line of the plurality of the word lines in a program operation, to apply a pulse of a step pass voltage to at least one non-selected word line adjacent to the selected word line in the program operation, and to apply a pulse of a pass voltage to remaining non-selected word lines except for the at least one non-selected word line in the program operation,
 wherein the at least one non-selected word line includes at least one first non-selected word line, and
 the pulse of the step pass voltage applied to the at least one first non-selected word line is changed from a first voltage level higher than the pass voltage to a second voltage level lower than the first voltage level.

2. The semiconductor memory device of claim 1, wherein the at least one non-selected word line further includes at least one second non-selected word line spaced apart from the selected word line by a second distance, and
 the at least one first non-selected word line is spaced apart from the selected word line by a first distance greater than the second distance.

3. The semiconductor memory device of claim 2, wherein the pulse of the step pass voltage applied to the at least one second non-selected word line is changed from a third voltage level to a fourth voltage level higher than the third voltage level.

4. The semiconductor memory device of claim 3,
 wherein the third voltage level is lower than the pass voltage and the fourth voltage level is higher than the pass voltage.

5. The semiconductor memory device of claim 3, wherein changing the pulse of the step pass voltage applied to the at least one first non-selected word line from the first voltage level to the second voltage level precedes changing the pulse of the step pass voltage applied to the at least one second non-selected word line from the third voltage level to the fourth voltage level.

6. The semiconductor memory device of claim 1, wherein the pulse of the program voltage comprises at least one step voltage.

7. The semiconductor memory device of claim 1, wherein the second voltage level corresponds to the pass voltage.

8. A method of operating a semiconductor memory device, the semiconductor memory device comprising a selected word line, at least one first non-selected word line spaced apart from the selected word line by a first distance, at least one second non-selected word line spaced apart from the selected word line by a second distance less than the first distance, and remaining non-selected word lines, the method comprising:
 driving the selected word line with a pulse of a program voltage and driving the remaining non-selected word lines with a pulse of a pass voltage;
 changing a voltage level of the at least one first non-selected word line from a first voltage level higher than the pass voltage to a second voltage level lower than the first voltage level during the driving the selected word line with the pulse of the program voltage; and changing a voltage level of the at least one second non-selected word line from a third voltage level lower than the pass voltage to a fourth voltage level higher than the third voltage level during the driving the selected word line with the pulse of the program voltage.

9. The method of claim 8, wherein the at least one second non-selected word line is adjacent to the selected word line and the second distance is a minimum distance between word lines.

10. The method of claim 9, wherein the at least one first non-selected word line is adjacent to the at least one second non-selected word line.

11. The method of claim 8, wherein the pulse of the program voltage includes at least one step voltage.

12. The method of claim 8, wherein the second voltage level corresponds to the pass voltage and the fourth voltage level is higher than the pass voltage.

13. The method of claim 8, wherein the changing the voltage level of the at least one first non-selected word line and the changing the voltage level of the at least one second non-selected word line are sequentially performed.

14. The method of claim 8, wherein the changing the voltage level of the at least one first non-selected word line is performed during a program period in which the program voltage rises.

15. The method of claim 8, wherein the changing the voltage level of the at least one second non-selected word line is performed during a program period in which the program voltage is driven at a preset step voltage.

16. An operating method of a memory device including first to fourth rows of memory cells, the operating method comprising:
   applying a pulse of a program voltage to the first row;
   applying a pulse of a first sequence of first and second step voltages to the second row during the applying the pulse of the program voltage;
   applying a pulse of a second sequence of third and fourth step voltages to the third row during the applying the pulse of the program voltage; and
   applying a pulse of a pass voltage to the fourth row during the applying the pulse of the program voltage, wherein:
   the second to fourth rows are arranged sequentially farther from the first row,
   the first step voltage has a lower level than the pass voltage,
   each of the second and third step voltages has a higher level than the pass voltage, and
   the fourth step voltage has substantially the same level as the pass voltage.

17. The operating method of claim 16, wherein the applying the first sequence includes changing the first step voltage to the second step voltage while a voltage level of the first row is stable at a level of the program voltage.

18. The operating method of claim 16, wherein the applying the second sequence includes changing the third step voltage to the fourth step voltage while a voltage level of the first row is transitioning to a level of the program voltage.

* * * * *